United States Patent
Choi

(10) Patent No.: US 10,063,137 B2
(45) Date of Patent: Aug. 28, 2018

(54) REACTIVE POWER COMPENSATION SYSTEM AND METHOD THEREOF

(71) Applicant: LSIS CO., LTD., Gyeonggi-do (KR)

(72) Inventor: Yong-Kil Choi, Gyeonggi-do (KR)

(73) Assignee: LSIS CO., LTD., Anyang-si, Gyeonggi-Do (KR)

( * ) Notice: Subject to any disclaimer, the term of this patent is extended or adjusted under 35 U.S.C. 154(b) by 0 days.

(21) Appl. No.: 15/585,215

(22) Filed: May 3, 2017

(65) Prior Publication Data

US 2017/0358983 A1 Dec. 14, 2017

(30) Foreign Application Priority Data

Jun. 9, 2016 (KR) .................. 10-2016-0071907

(51) Int. Cl.
*H02M 1/42* (2007.01)
*G01R 25/00* (2006.01)
*H02J 3/01* (2006.01)
*H02J 3/18* (2006.01)

(52) U.S. Cl.
CPC .............. *H02M 1/42* (2013.01); *G01R 25/00* (2013.01); *H02J 3/01* (2013.01); *H02J 3/1864* (2013.01); *Y02E 40/30* (2013.01)

(58) Field of Classification Search
CPC ...... H02M 1/42; H02M 1/4208; G01R 25/00; H02J 3/1807; H02J 3/1821; H02J 3/1878
See application file for complete search history.

(56) References Cited

U.S. PATENT DOCUMENTS

| 4,672,298 A * | 6/1987 | Rohatyn ............. G05F 1/70 323/208 |
| 7,683,589 B2 * | 3/2010 | Temma ............... G05F 1/70 323/210 |
| 2009/0115257 A1 | 5/2009 | Letourneau et al. |
| 2012/0212191 A1 * | 8/2012 | Yuzurihara ......... H02M 1/4208 323/205 |
| 2013/0265014 A1 * | 10/2013 | Franken ............. H02J 3/1821 323/207 |
| 2016/0043635 A1 | 2/2016 | Stewart |
| 2017/0346287 A1 * | 11/2017 | Choi ..................... H02J 3/01 |

FOREIGN PATENT DOCUMENTS

| EP | 0 483 405 A1 | 5/1992 |
| EP | 0872941 B1 | 10/2002 |
| JP | 2000222053 A | 8/2000 |

(Continued)

OTHER PUBLICATIONS

Search Report dated May 31, 2017 issued in corresponding European Application No. 17157156.5.

(Continued)

*Primary Examiner* — Matthew Nguyen
(74) *Attorney, Agent, or Firm* — K&L Gates LLP

(57) ABSTRACT

The present disclosure relates a reactive power compensation system including a detection unit for acquiring loading state information of a plurality of loads, a reactive power compensation unit for compensating reactive power, and a controller for controlling the reactive power compensation unit to perform flicker compensation or power factor compensation based on a control signal according to the loading state information.

11 Claims, 3 Drawing Sheets

(56) References Cited

FOREIGN PATENT DOCUMENTS

| | | |
|---|---|---|
| JP | 2001-78361 A | 3/2001 |
| JP | 2001078360 A | 3/2001 |
| JP | 2003518899 A | 6/2003 |
| JP | 2006-311686 | 11/2006 |
| JP | 2011-45210 A | 3/2011 |
| JP | 2011172484 A | 9/2011 |
| JP | 2016-100967 A | 5/2016 |
| JP | 2016100967 A | 5/2016 |
| KR | 10-0545721 B1 | 8/2005 |
| KR | 10-2014-0052508 A | 5/2014 |
| WO | 2013/040490 A1 | 3/2013 |
| WO | 2014/099839 A2 | 6/2014 |

OTHER PUBLICATIONS

Japanese Office Action for related Japanese Application No. 2017-038461; action dated Jun. 5, 2018; (7 pages).

* cited by examiner

REACTIVE POWER COMPENSATION SYSTEM AND METHOD THEREOF

CROSS-REFERENCE TO RELATED APPLICATIONS

This application claims the priority of Korean Patent Application No. 10-2016-0071907 filed on Jun. 9, 2016, in the Korean Intellectual Property Office, the disclosure of which is hereby incorporated by reference in its entirety.

BACKGROUND

1. Technical Field

The present disclosure relates to a reactive power compensation system and a method thereof.

2. Description of the Related Art

When power is supplied to a receiving end connected to a load, the power is not all used by the load. In other words, the power is not all used as active power by the load and part of the power is lost as reactive power not contributing to a real work.

To minimize or compensate the reactive power, a reactive power compensation system is employed.

The reactive power compensation system adjusts a phase of a voltage or a phase of current and thus the reactive power may be minimized.

The reactive power should be compensated differently depending on a loading state. For example, when a load is not input, the reactive power is compensated for improving a power factor. When a load is input, a flicker may be generated so that the reactive power is compensated to improve the flicker.

The load input may signify that a voltage is supplied to the load and thus the load is operated.

However, in a conventional reactive power compensation system, since the reactive power is simply compensated without considering a loading state, optimization of compensation of reactive power depending on a loading state is impossible.

SUMMARY

It is an object of the present disclosure to address the above-described problems and other problems.

It is another object of the present disclosure to provide a reactive power compensation system for compensating reactive power depending on a loading state, and a method thereof.

Objects of the present disclosure are not limited to the above-described objects and other objects and advantages can be appreciated by those skilled in the art from the following descriptions. Further, it will be easily appreciated that the objects and advantages of the present disclosure can be practiced by means recited in the appended claims and a combination thereof.

In accordance with one aspect of the present disclosure, a reactive power compensation system which includes a detection unit for acquiring loading state information of a plurality of loads, a reactive power compensation unit for compensating reactive power, and a controller for controlling the reactive power compensation unit to perform flicker compensation or power factor compensation based on a control signal according to the loading state information.

In accordance with one aspect of the present disclosure, a method of compensating reactive power includes acquiring loading state information with respect to a plurality of loads, providing a control signal according to the loading state information to the reactive power compensation unit to perform flicker compensation or power factor compensation, and operating, in response to the control signal, one or more of a Thyristor-controlled reactor, a Thyristor-switched capacitor, and a fixed capacitor FC including the reactive power compensation unit.

DETAILED DESCRIPTION

Figure 1:
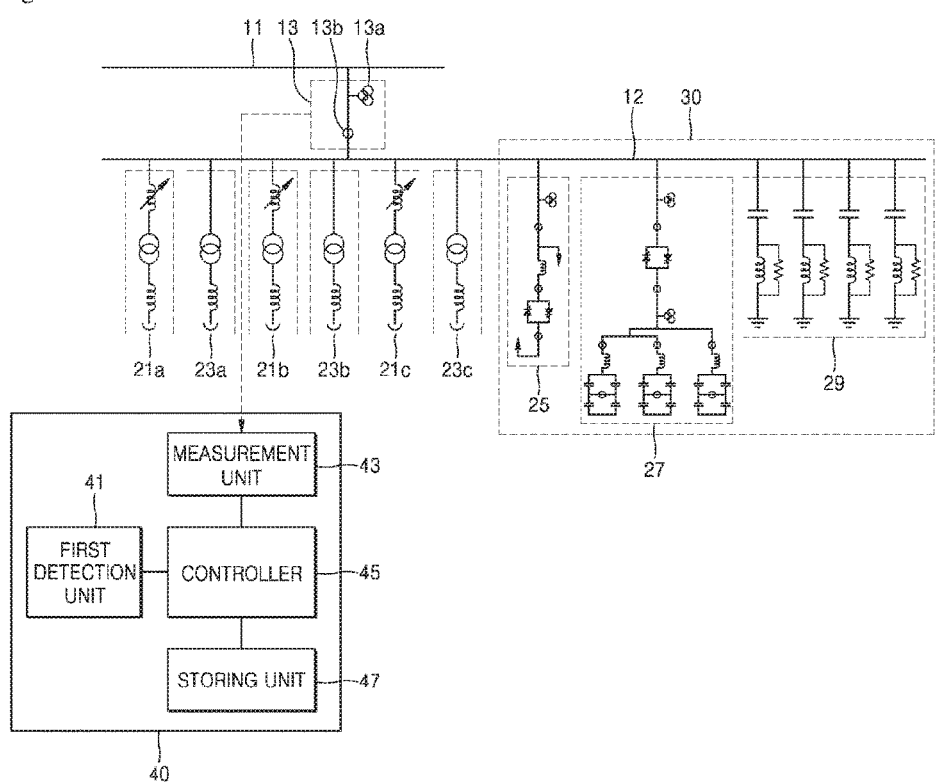
FIG. 1 illustrates a loss-measuring device of a reactive power compensation system according to an embodiment of the present disclosure.

The above objects, features and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

As the inventive concept allows for various changes and numerous embodiments, particular embodiments will be illustrated in the drawings and described in detail in the written description, wherein like reference numerals in the drawings denote like elements, and thus their description will not be repeated. The suffix "module" and "unit" for components, which are used in the description below, are assigned and mixed in consideration of only the easiness in writing the specification. That is, the suffix itself does not have different meanings or roles. However, this is not intended to limit the present inventive concept to particular modes of practice, and it is to be appreciated that all changes, equivalents, and substitutes that do not depart from the spirit and technical scope of the present inventive concept are encompassed in the present inventive concept. In the description of the present inventive concept, certain detailed explanations of related art are omitted when it is deemed that they may unnecessarily obscure the essence of the inventive concept.

FIG. 1 illustrates a loss-measuring device of a reactive power compensation system according to an embodiment of the present disclosure.

Referring to FIG. 1, the loss-measuring device of the reactive power compensation system according to the present embodiment may include a reactive power compensation unit 30 and a control system 40.

A plurality of loads 21a. 21b, 21c, 23a. 23b, and 23c may be connected to a receiving end 11. In detail, a branch line 12 may be branched from the receiving end 11, and the loads 21a, 21b, 21c, 23a, 23b, and 23c may be connected to the branch line 12.

Although FIG. 1 illustrates that the branch line 12 is connected to the receiving end 11, the loads 21a, 21b, 21c, 23a, 23b, and 23c may be directly connected to the receiving end 11 without the branch line 12.

The loads 21a, 21b, 21c, 23a, 23b, and 23c may be connected to a system other than the receiving end 11. The system may be an AC system, a DC system, or a HVDC system, but the present disclosure is not limited thereto.

The loads 21a, 21b, 21c, 23a, 23b, and 23c may be loads provided in an ironworks, for example, arc furnaces 21a, 21b, and 21c or smelting furnaces 23a, 23b, and 23c, but the present disclosure is not limited thereto.

The reactive power compensation unit 30 may be connected parallel to the loads 21a, 21b, 21c, 23a, 23b, and 23c and commonly with the loads 21a, 21b, 21c, 23a, 23b, and 23c to the branch line 12 or the receiving end 11, but the present disclosure is not limited thereto. Accordingly, power supplied to the receiving end 11 may be supplied not only to the loads 21a, 21b, 21c, 23a. 23b, and 23c, but also to the reactive power compensation unit 30.

The reactive power compensation unit 30 may include a Thyristor-controlled reactor (TCR) 25, a Thyristor-switched capacitor (TSC) 27, and a harmonic filter unit 29.

The TCR 25 may include a reactor and a thyristor switch. The number or arrangement of reactors may be implemented by various methods.

Instead of the TCR 25 of FIG. 1, a fixed capacitor (FC) may be used, but the present disclosure is not limited thereto.

The TSC 27 may include a capacitor and a thyristor switch. The number or arrangement of capacitors may be implemented by various methods.

A power factor may be a ratio between active power and apparent power. The apparent power may denote the power supplied to the receiving end 11, whereas the active power may be apparent power exclusive of reactive power. Accordingly, as a power factor is improved due to compensation of power factor, active power increases so that power loss decreases and the power may be efficiently used.

The harmonic filter unit 29 may include a plurality of filters. Each filter may include a resistor, a capacitor, and an inductor. Although the resistor and the inductor may be connected in parallel, but the present disclosure is not limited thereto.

The reactive power compensation unit 30 may compensate the reactive power, in detail, a power factor or flicker.

The control system 40 may include a first detection unit 41, a measurement unit 43, a controller 45, and a storing unit 47.

For reference, although the measurement unit 43 and the controller 45 may be implemented in a single integrated unit not separate units, in the present invention, both are implemented as separate units for convenience of explanation.

The first detection unit 41 is installed at each of the loads 21a, 21b, 21c, 23a, 23b, and 23c and obtains loading state information indicating whether each of the loads 21a, 21b, 21c, 23a, 23b, and 23c is input or not. The first detection unit 41 may be, for example, current sensor for detecting current flowing in each of the loads 21a, 21b, 21c, 23a, 23b, and 23c, but the present disclosure is not limited thereto.

A loading state signal may be detected according to whether current flows in each of the loads 21a, 21b, 21c, 23a, 23b, and 23c or not. The loading state signal may be referred to as load state information.

For example, when no current flows in each of the loads 21a, 21b, 21c, 23a, 23b, and 23c, a signal "0", that is, a low-level signal, may be detected by the first detection unit 41 and may be provided to the controller 45.

For example, when current flows in each of the loads 21a, 21b, 21c, 23a, 23b, and 23c, a signal "1", that is, a high level signal, is detected by the first detection unit 41 and may be provided to the controller 45. Although the high level signal may always have a high level signal (that is, 1) while current flows in each of the loads 21a, 21b, 21c, 23a, 23b, and 23c, or may cyclically have a high level signal (that is, 1), but the present disclosure is not limited thereto.

In contrast, when no current flows in each of the loads 21a, 21b, 21c, 23a, 23b, and 23c, a high level signal may be detected and provided to the controller 45. When current flows in each of the loads 21a, 21b, 21c. 23a, 23b, and 23c, a low-level signal may be detected and provided to the controller 45.

The controller 45 may recognize each loading state based on the signal provided from the first detection unit 41.

The measurement unit 43 may measure voltage data, current data, and a phase angle based on a voltage, a phase of a voltage, current, and a phase of current detected by a second detection unit 13 arranged between the receiving end 11 and the branch line 12 or arranged at an input side of the loads 21a, 21b, 21c, 23a, 23b, and 23c.

For example, a voltage, current, and a phase angle may be detected by the second detection unit 13 and then measured by the measurement unit 43 provided in the control system 40. In detail, a voltage and a voltage phase on the branch line 12 are detected by a transformer 13a of the second detection unit 13, and current and current phase flowing on the branch line 12 may be detected by current transformer 13b of the second detection unit 13. The voltage and voltage phase and the current and current phase are provided to the measurement unit 43, and the measurement unit 43 may measure voltage data, current data, and a phase angle based on the voltage, the voltage phase, the current, and the current phase.

The phase angle may be calculated based on the phase of a voltage and the phase of current. For example, when a phase of current is ahead of a phase of a voltage, it may be referred to as leading, and when a phase of a voltage is ahead of a phase of current, it may be referred to as lagging. For example, when a phase angle in leading is expressed by a positive phase angle, a phase angle in lagging may be expressed by a negative phase angle.

Although FIG. 1 illustrates that the second detection unit 13 is not included in the control system 40, the second detection unit 13 may be included or not included in the control system 40.

The second detection unit 13 may include the transformer 13a and the current transformer 13b. The transformer 13a may detect a voltage and a phase of a voltage at the receiving end 11, and the current transformer 13b may detect current and a phase of current flowing in a line of the receiving end 11.

The voltage data may be obtained by converting the voltage detected by the second detection unit 13 to a digital signal and then amplifying and/or modulating the signal.

The current data may be obtained by converting the current detected by the second detection unit 13 to a digital signal and then amplifying and/or modulating the signal.

The phase angle may be calculated based on the phase of a voltage and the phase of current. For example, when the phase of current is ahead of the phase of a voltage, it may be referred to as leading, and when the phase of a voltage is ahead of the phase of current, it may be referred to as lagging. For example, when a phase angle in leading is expressed by a positive phase angle, a phase angle in lagging may be expressed by a negative phase angle.

When the loads 21a, 21b, 21c, 23a, 23b, and 23c are directly connected to the receiving end 11, the transformer 13a of the second detection unit 13 may detect a voltage and a voltage phase on the line of the receiving end 11 and the current transformer 13b of the second detection unit 13 may detect a current and a current phase flowing in the line of the receiving end 11.

The controller 45 may determine a compensation control mode based on the loading state signal detected by the first detection unit 41 and compensate reactive power according to the determined compensation control mode.

The compensation control mode may include a power factor compensation control mode and a flicker compensation control mode.

The power factor compensation control mode may be a control mode of compensating reactive power by compensating a power factor, and the flicker compensation control mode may be a control mode of compensating reactive power by compensating a flicker.

The power factor compensation control mode may be a control mode used when the loads 21a, 21b, 21c. 23a, 23b, and 23c are not input. When the loads 21a, 21b, 21c. 23a, 23b, and 23c are not input, flicker is hardly generated and thus a power factor may be compensated in such a situation. As the power factor is compensated, reactive power may be reduced or removed and thus active power may increase or approach apparent power supplied to the receiving end, thereby improving the power factor.

The flicker compensation control mode may be a control mode used when the loads 21a, 21b, 21c, 23a, 23b, and 23c are input. When at least one of the loads 21a, 21b, 21c, 23a, 23b, and 23c is input, flicker may be generated. In some cases, flicker may be generated even when one load is input, and in another case, flicker may be generated when fives loads are input. In some cases, flicker may not be generated even when all loads are input.

When no flicker is generated even when at least one load is input, flicker does not need to be compensated so that flicker compensation may not be performed, but the present disclosure is not limited thereto.

When compensation of reactive power is needed even when flicker compensation is not needed because no flicker is generated in spite of input of at least one load, a power factor may be compensated for compensation of the reactive power, but the present disclosure is not limited thereto.

The controller 45 may control the reactive power compensation unit 30 to perform flicker compensation or power factor compensation based on the determined compensation control mode.

For example, when it is determined to perform the power factor compensation control mode, the controller 45 may generate a first control signal and provide the first control signal to the reactive power compensation unit 30. Then, the reactive power compensation unit 30 may switch the thyristor switch of the TSC 27 in response to the first control signal. Accordingly, the power factor may be compensated by a capacitor, that is, a capacitive component of a capacitor.

In another example, the reactive power compensation unit 30, in response to the first control signal, may operate not only the TSC 27, but also the TCR 25 or a fixed capacitor FC, but the present disclosure is not limited thereto. For example, when it is determined to perform the flicker compensation control mode, the controller 45 may generate a second control signal and provide the second control signal to the reactive power compensation unit 30. Then, the reactive power compensation unit 30, in response to the second control signal, may switch the thyristor switch of the TCR 25. Accordingly, the flicker may be compensated by an inductive component of a reactor.

In another example, the reactive power compensation unit 30, in response to the second control signal, may operate not only the TCR 25, but also the TSC 27 or the fixed capacitor FC, but the present disclosure is not limited thereto.

When compensation of reactive power is needed although flicker compensation is not needed because no flicker is generated in spite of input of at least one load, the controller 45 may generate a third control signal and provide the third control signal to the TSC 27, not the TCR 25. The TSC 27, in response to the third control signal, may switch the thyristor switch of the TSC 27 so that the power factor may be compensated by a capacitor, that is, a capacitive component of a capacitor. In other words, when no flicker is generated even when at least one load is input, the flicker compensation is unnecessary. Since lowering of the power factor may be generated by the reactive power though the flicker compensation is unnecessary, the reactive power may be reduced or minimized through the power factor compensation so that the power factor may be improved.

All of the first control signal, the second control signal, and the third control signal may include information about an amount of compensation of reactive power (hereinafter, referred to as the reactive compensation amount information) calculated based on the voltage data, the current data, and the phase angle measured by the measurement unit 43.

In other words, the controller 45 may calculate the reactive power based on the voltage data, the current data, and the phase angle measured by the measurement unit 43, and calculate a reactive power compensation amount based on the calculated reactive power.

The reactive power compensation amount may be calculated by an expression of a power factor compensation target value—a current power factor.

The reactive power compensation amount may be calculated to be +Q or −Q according to whether it is a leading reactive power or a lagging reactive power.

The leading reactive power may be a reactive power when the phase of current is ahead of the phase of a voltage, and the lagging reactive power may be a reactive power when the phase of a voltage is ahead of the phase of current.

The controller 45 may provide a control signal including the reactive power compensation amount information, that is, one of the first to third control signals, to the reactive power compensation unit 30.

The reactive power compensation unit 30 may control the TCR 25, the TSC 27, and the fixed capacitor FC according to which control mode a control signal belongs, thereby compensating the flicker or the power factor.

According to the present disclosure, since the power factor compensation and the flicker compensation may be selective controlled, compensation of reactive power optimized and effective for each situation may be possible according to the loading state.

The storing unit 47 may store various pieces of setting information, for example, the type and amount of a work to be processed by each of the loads 21a, 21b, 21c, 23a, 23b, and 23c.

The storing unit 47 may store control mode information determined by the controller 45, state information of a reactive power compensation system, state information of each of the loads 21a, 21b, 21c, 23a, 23b, and 23c, etc.

The storing unit 47 may store various pieces of information needed for implementing the present disclosure that is not described above.

Figure 2:
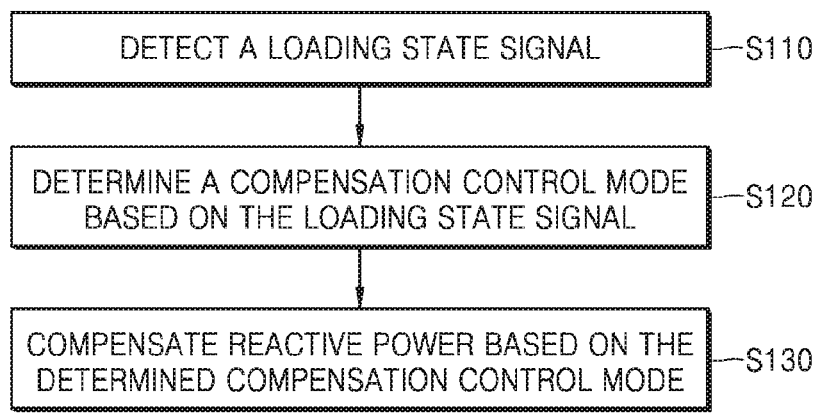
FIG. 2 is a flowchart for explaining a compensation method of a reactive power compensation system according to an embodiment of the present disclosure.

FIG. 2 is a flowchart for explaining a compensation method of a reactive power compensation system according to an embodiment of the present disclosure.

Referring to FIGS. 1 and 2, the first detection unit 41 provided at each of the loads 21a. 21b, 21c, 23a, 23b, and 23c may detect a loading state signal (S110). For example, the first detection unit 41 may be a current sensor for detecting current flowing in each of the loads 21a, 21b, 21c, 23a, 23b, and 23c, but the present disclosure is not limited thereto. Accordingly, the first detection unit 41 may detect a signal related to whether the current flowing in each of the loads 21a, 21b, 21c, 23a, 23b, and 23c is detected, that is, a high-level signal or a low-level signal.

The detected loading state signal may be provided.

The controller 45 may determined a compensation control mode based on the loading state signal included in the above signal (S120).

The compensation control mode may be one of the power factor compensation control mode and the flicker compensation control mode.

The controller 45 may generate a control signal according to the determined compensation control mode, and compensate reactive power based on the generated control signal (S130).

Figure 3:
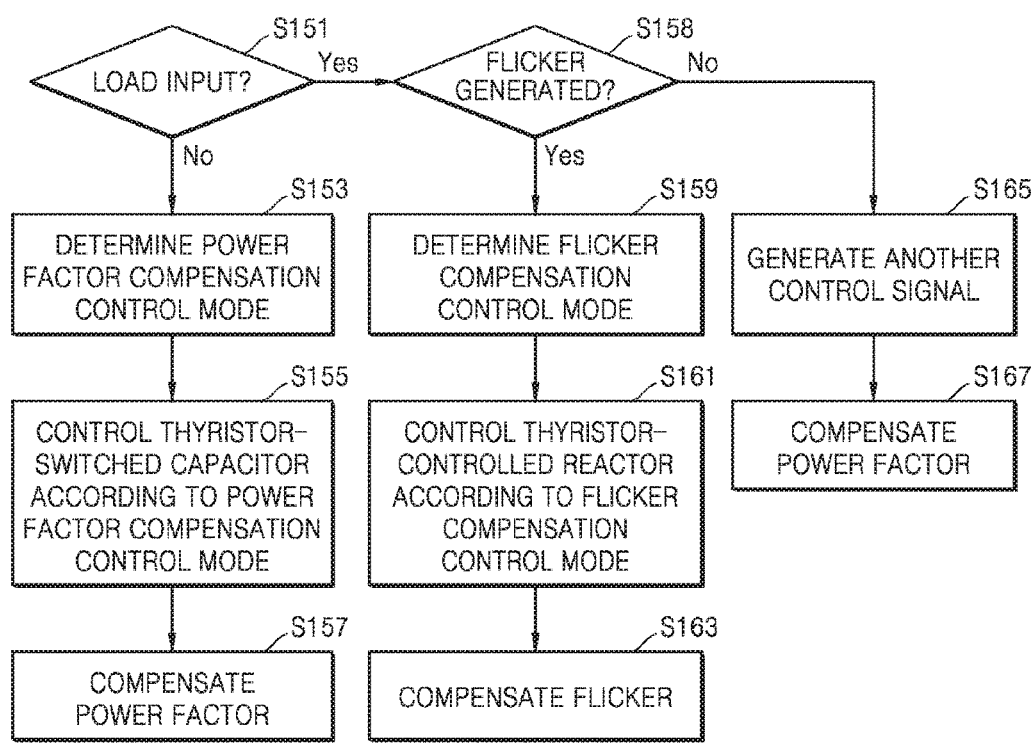
FIG. 3 is a flowchart showing S120 and S130 of FIG. 2 in detail.

The operations S120 and S130 are described in detail with reference to FIGS. 1 and 3.

The controller 45 may determine whether the loads 21a, 21b, 21c, 23a, 23b, and 23c are input, based on the loading state signal detected by the first detection unit 41 (S151).

For example, when the loading state signal is a low-level signal, it is determined that the loads 21a, 21b, 21c, 23a, 23b, and 23c are not input. For example, when the loading state signal is a high-level signal, it may be determined that the loads 21a, 21b, 21c, 23a. 23b, and 23c are input.

If it is determined that the loads 21a, 21b, 21c, 23a, 23b, and 23c are not input, the controller 45 may determine the control mode to be the power factor compensation control mode (S153), and control the TSC 27 according to the power factor compensation control mode (S155).

When the control mode is determined to be the power factor compensation control mode, the controller 45 may calculate reactive power based on the voltage data, the current data, and the phase angle provided by the measurement unit 43, and calculate a reactive power compensation amount based on the calculated reactive power.

The controller 45 may generate a first control signal including the reactive power compensation amount information and provide the generated signal to the reactive power compensation unit 30.

The reactive power compensation unit 30, in response to the first control signal, may compensate a power factor by controlling the thyristor switch of the TSC 27 (S157).

In another example, the reactive power compensation unit 30, in response to the first control signal, may operate not only the TSC 27, but also the TCR 25 or the fixed capacitor FC, but the present disclosure is not limited thereto.

In other words, the TSC 27 only may be operated according to the reactive power compensation amount information included in the first control signal, or one or more of the TCR 25, the TSC 27, and the fixed capacitor FC may be operated.

In S151, if it is determined that the loads 21a, 21b, 21c, 23a, 23b, and 23c are input, the controller 45 may determine whether flicker is generated based on the signal provided by the first detection unit 41 (S158).

If flicker is generated as a result of the determination, the controller 45 may determine the control mode to be a flicker compensation control mode (S159), and control the TCR 25 according to the flicker compensation control mode (S161).

If the control mode is determined to be the flicker compensation control mode, the controller 45 may calculate reactive power based on the voltage data, the current data, and the phase angle provided by the measurement unit 43, and calculate the reactive power compensation amount based on the calculated reactive power.

The controller 45 may generate a second control signal including the reactive power compensation amount information, and provide the generated signal to the reactive power compensation unit 30.

The reactive power compensation unit 30 may provide the second control signal to the TCR 25, and the thyristor switch of the TCR 25 is controlled in response to the second control signal so that flicker may be compensated (S163).

In another example, the reactive power compensation unit 30, in response to the second control signal, may operate not only the TCR 25, but also the TSC 27 or the fixed capacitor FC but the present disclosure is not limited thereto.

In other words, the TCR 25 only may be operated according to the reactive power compensation amount information included in the second control signal, or one or more of the TCR 25, the TSC 27, and the fixed capacitor FC may be operated.

If no flicker is generated as a result of the determination in S158, the controller 45 may generate a third control signal (another control signal) including the reactive power compensation amount information calculated based on the voltage data, the current data, and the phase angle provided by the measurement unit 43, and provide the generated signal to the reactive power compensation unit 30 (S165).

The reactive power compensation unit 30, in response to the third control signal, may compensate a power factor by using the TSC 27 (S167). In other words, when no flicker is generated even when the control mode is determined to be a flicker compensation control mode, not the TCR 25, but the TSC 27 is controlled to perform the power factor compensation. Accordingly, when no flicker is generated, the reactive power that may be present may be compensated.

In another example, the reactive power compensation unit 30, in response to the third control signal, may operate not only the TSC 27, but also the TCR 25 or the fixed capacitor FC, but the present disclosure is not limited thereto. In other words, the TSC 27 only may be operated according to the reactive power compensation amount information included in the third control signal, or one or more of the TCR 25, the TSC 27, and the fixed capacitor FC may be operated.

As described above, in the reactive power compensation system according to the present disclosure, and the method thereof, the power factor compensation and the flicker compensation may be selectively controlled according to the loading state. In other words, when a load is not input, the power factor compensation may be performed, and when a load is input, the flicker compensation may be performed. Accordingly, compensation of reactive power optimized and effective for each situation may be possible.

The present disclosure described above may be variously substituted, altered, and modified by those skilled in the art to which the present inventive concept pertains without departing from the scope and sprit of the present disclosure. Therefore, the present disclosure is not limited to the above-mentioned exemplary embodiments and the accompanying drawings.

What is claimed is:

1. A reactive power compensation system comprising:
a detection unit configured to acquire loading state information of a plurality of loads;
a reactive power compensation unit configured to compensate reactive power; and
a controller configured to:
determine whether a control mode of the system is a power factor compensation control mode or a flicker compensation control mode based on the loading state information; and
control the reactive power compensation unit to selectively perform flicker compensation or power factor compensation according to the determined control mode.

2. The reactive power compensation system of claim 1, further comprising a measurement unit configured to measure voltage data, current data, and a phase angle with respect to the loads.

3. The reactive power compensation system of claim 2, wherein the controller generates a control signal according to the determined control mode to control the power factor compensation or the flicker compensation.

4. The reactive power compensation system of claim 3, wherein the reactive power compensation unit comprises a Thyristor-switched capacitor, a Thyristor-controlled reactor, and a fixed capacitor, and
one or more of the Thyristor-switched capacitor, the Thyristor-controlled reactor, and the fixed capacitor are operated according to the control signal.

5. The reactive power compensation system of claim 3, wherein the controller acquires reactive power compensation amount information based on the voltage data, the current data, and the phase angle measured by the measurement unit, and generates a control signal including the reactive power compensation amount information.

6. The reactive power compensation system of claim 3, wherein the controller provides the control signal to a Thyristor-switched capacitor to compensate a power factor when no flicker is generated even when the control mode is determined to be the flicker compensation control mode.

7. The reactive power compensation system of claim 1, wherein the detection unit comprises a current sensor.

8. The reactive power compensation system of claim 1, wherein the loading state information is acquired from current detected by each of the loads.

9. A method of compensating reactive power, the method comprising:
acquiring loading state information with respect to a plurality of loads;
determining whether a control mode of the system is a power factor compensation control mode or a flicker compensation control mode based on the loading state information;
providing a control signal according to the determined control mode to a reactive power compensation unit to selectively perform flicker compensation or power factor compensation; and
operating, in response to the control signal, one or more of a Thyristor-controlled reactor, a Thyristor-switched capacitor, and a fixed capacitor that are included in the reactive power compensation unit.

10. The method of claim 9, further comprising measuring voltage data, current data, and a phase angle with respect to the loads.

11. The method of claim 10, wherein the providing of the control signal to the reactive power compensation unit comprises:
acquiring reactive power compensation amount information based on the measured voltage data, current data, and phase angle;
generating a control signal including the acquired reactive power compensation amount information; and
providing the generated control signal to the reactive power compensation unit.

* * * * *